(12) United States Patent
Subramani et al.

(10) Patent No.: US 11,183,375 B2
(45) Date of Patent: Nov. 23, 2021

(54) DEPOSITION SYSTEM WITH MULTI-CATHODE AND METHOD OF MANUFACTURE THEREOF

(71) Applicant: Applied Materials, Inc., Santa Clara, CA (US)

(72) Inventors: Anantha K. Subramani, San Jose, CA (US); Deepak Jadhav, Hubli (IN); Ashish Goel, Bangalore (IN); Hanbing Wu, Millbrae, CA (US); Prashanth Kothnur, San Jose, CA (US); Chi Hong Ching, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 952 days.

(21) Appl. No.: 14/606,367

(22) Filed: Jan. 27, 2015

(65) Prior Publication Data

US 2015/0279635 A1    Oct. 1, 2015

Related U.S. Application Data

(60) Provisional application No. 61/973,210, filed on Mar. 31, 2014.

(51) Int. Cl.
*C23C 14/34* (2006.01)
*H01J 37/34* (2006.01)
(Continued)

(52) U.S. Cl.
CPC ...... *H01J 37/3408* (2013.01); *C23C 14/3492* (2013.01); *C23C 14/352* (2013.01);
(Continued)

(58) Field of Classification Search
CPC .. C23C 14/3492; C23C 14/352; C23C 14/545
See application file for complete search history.

(56) References Cited

U.S. PATENT DOCUMENTS 5,455,197 A * 10/1995 Ghanbari ............ C23C 14/0036
204/192.13
7,815,782 B2   10/2010 Inagawa et al.
(Continued)

FOREIGN PATENT DOCUMENTS

JP    2001107228      4/2001
JP    2001107228 A    4/2001
(Continued)

OTHER PUBLICATIONS

International Search Report and Written Opinion for PCT Application No. PCT/US2015/023427 dated Jun. 30, 2015.
(Continued)

*Primary Examiner* — Jason Berman
(74) *Attorney, Agent, or Firm* — Servilla Whitney LLC

(57) ABSTRACT

A deposition system, and a method of operation thereof, includes: a cathode; a shroud below the cathode; a rotating shield below the cathode for exposing the cathode through the shroud and through a shield hole of the rotating shield; and a rotating pedestal for producing a material to form a carrier over the rotating pedestal, wherein the material having a non-uniformity constraint of less than 1% of a thickness of the material and the cathode having an angle between the cathode and the carrier.

10 Claims, 10 Drawing Sheets

(51) Int. Cl.
  *C23C 16/34* (2006.01)
  *C23C 16/40* (2006.01)
  *C23C 14/54* (2006.01)
  *C23C 14/35* (2006.01)

(52) U.S. Cl.
  CPC ............ *C23C 14/545* (2013.01); *C23C 16/34* (2013.01); *C23C 16/405* (2013.01); *H01J 37/3417* (2013.01); *H01J 37/3435* (2013.01); *H01J 37/3447* (2013.01)

(56) References Cited

U.S. PATENT DOCUMENTS

| | | | |
|---|---|---|---|
| 8,173,248 B2 | 5/2012 | Hovsepian et al. | |
| 2002/0064595 A1 | 5/2002 | Nomura et al. | |
| 2004/0195639 A1* | 10/2004 | Drewes ................. | B82Y 25/00 257/421 |
| 2004/0231980 A1 | 11/2004 | Takahashi | |
| 2007/0080059 A1* | 4/2007 | Takahashi ............. | C23C 14/352 204/298.01 |
| 2007/0095651 A1* | 5/2007 | Ye ..................... | H01L 21/67011 204/192.1 |
| 2009/0068450 A1 | 3/2009 | Muenz et al. | |
| 2009/0294279 A1* | 12/2009 | Kikuchi ................. | B82Y 25/00 204/192.15 |
| 2010/0236918 A1 | 9/2010 | Imakita et al. | |
| 2011/0147199 A1* | 6/2011 | Ohishi ................... | C23C 14/02 204/192.12 |
| 2011/0259733 A1 | 10/2011 | Watanabe et al. | |

FOREIGN PATENT DOCUMENTS

| | | |
|---|---|---|
| JP | 2005048222 | 2/2005 |
| JP | 2010126789 | 6/2010 |
| KR | 10-1194645 B1 | 10/2012 |

OTHER PUBLICATIONS

PCT International Preliminary Reporton Patentability in PCT/US2015/023427 dated Oct. 13, 2016, 9 pages.
Extended European Search Report in EP 15773036.7 dated Sep. 28, 2017, 10 pages.
Supplementary European Search Report in EP 15773036.7 dated Oct. 17, 2017, 1 page.

* cited by examiner

| Layer 204 | 206 | Purpose |
|---|---|---|
| | TaN/TiN (75-100nm) | Hardmask |
| | Ru(5nm) | Top Electrode |
| | Ta (5nm) | Capping Layer |
| | CoFeB (1-2nm) | Free Layer |
| | MgO (1-2nm) | Tunnel Oxide |
| | CoFeB (2-3nm) | Ferromagnetic |
| | Ru (0.9nm) | Coupling |
| | CoFe (2-3nm) | Ferromagnetic |
| | IrMn or PtMn (7-20nm) | Anti-Ferromagnetic Layer |
| | Ru (5-20nm) | Bottom Electrode |
| | Ta (5nm) | Adhesion/ Seed |

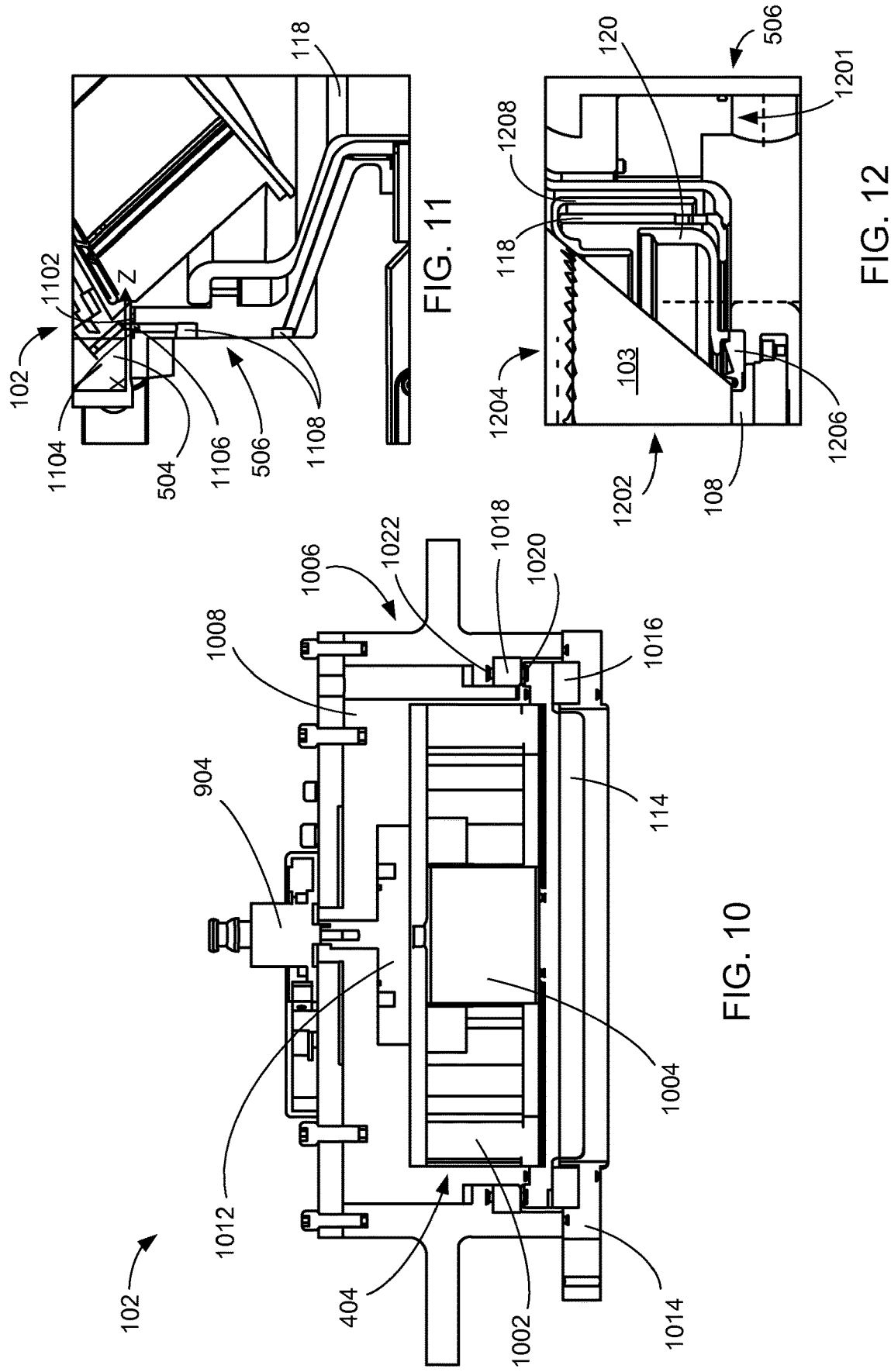

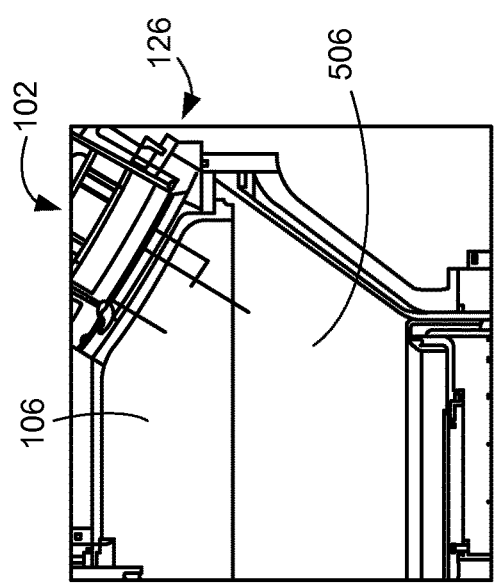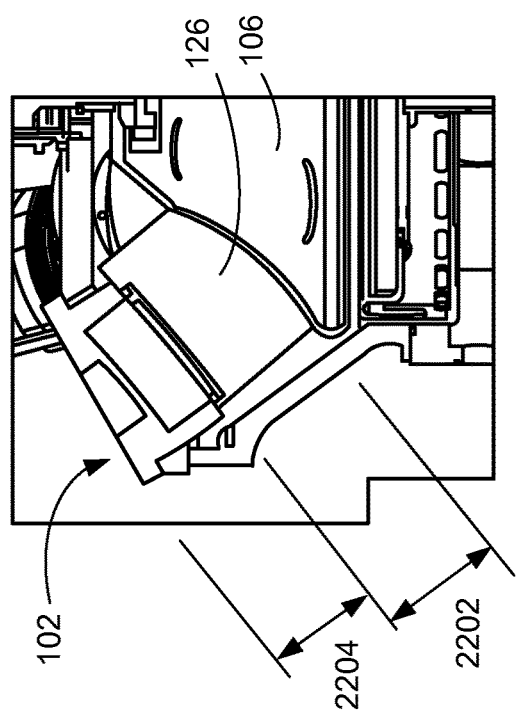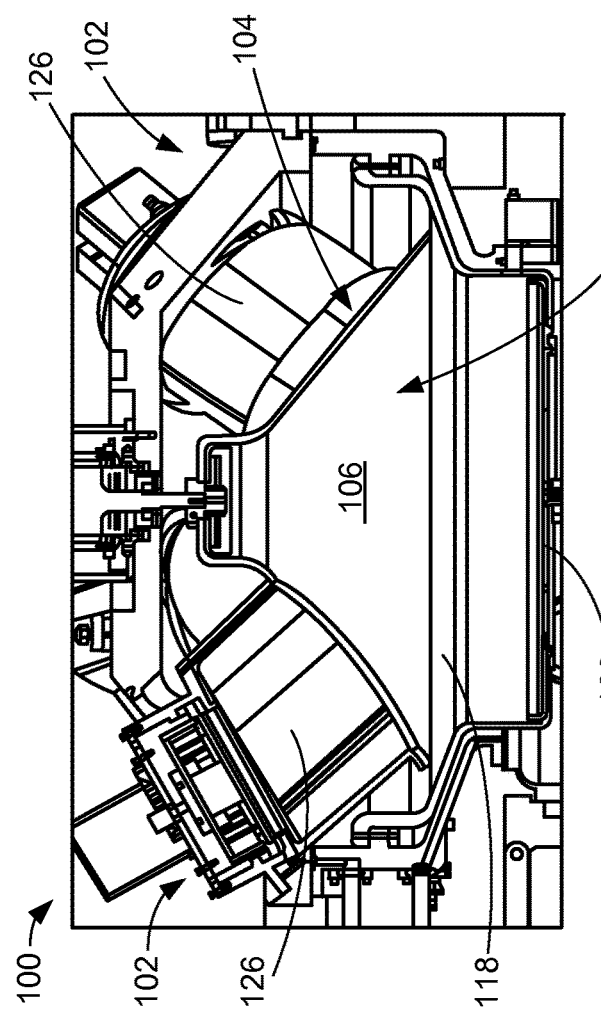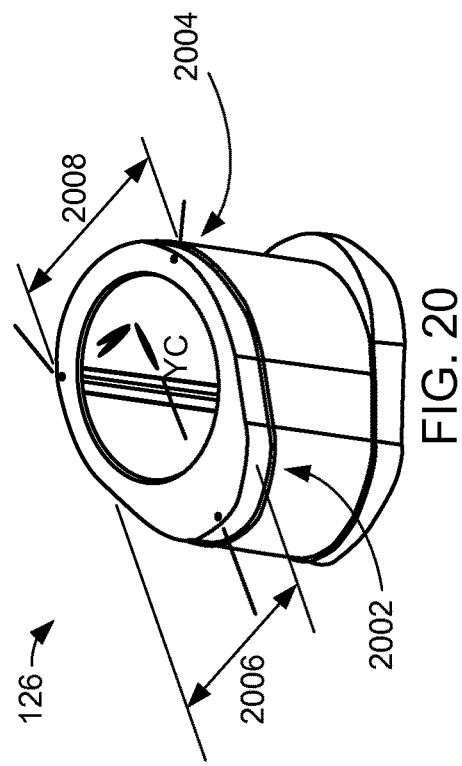

| Contamination tests for MC chamber | | |
|---|---|---|
| Tests | Description | Counts |
| Baseline | Rotating shield (RS) | ~ 3900 |
| Pre-clean target | Pre-sputter behind RS | ~ 4100 |
| Shroud | 5.5" Gnd Shroud | ~ 470 |
| DC ground | Better grounding | ~ 4600 |
| DC strike | No initial DC strike | ~ 4500 |
| Adaptor | New lower adaptor | ~ 95 |
| Magnet effect | Different magnets | ~ 4800 |
| Pressure effect | Higher pressure | ~ 16 |
| Proto 2.2 | New rotating shield with new long shroud | ~ 66 |

DEPOSITION SYSTEM WITH MULTI-CATHODE AND METHOD OF MANUFACTURE THEREOF

CROSS-REFERENCE TO RELATED APPLICATION(S)

This application claims the benefit of U.S. Provisional Patent Application Ser. No. 61/973,210 filed Mar. 31, 2014, and the subject matter thereof is incorporated herein by reference thereto.

TECHNICAL FIELD

The present invention relates generally to a deposition system, and more particularly to a system for a deposition system with multi-cathode.

BACKGROUND

Various methods for removing or building up material layers for semiconductor devices are known. Physical vapor deposition (PVD) methods are often used in the semiconductor industry. In principle, this is a plasma discharge method in which process gas ions are generated in a process gas between two electrodes with an applied electric field. The process gas ions are then accelerated further with the electric field to a target of a material that is to be deposited on a substrate.

In order to improve the deposition rates and yields, the plasma density above the target is increased by building up a magnetic field in addition to the electric field in the region of the target. This magnetic field, a term that is then also used is magnetron sputtering, also reduces the loss of charge carriers, in particular the loss of electrons. In order to improve the uniformity of the removal of target material at the target, the magnetic field is caused to rotate with regard to the target such that a uniform removal of target material is produced.

What is problematic in the context of magnetron sputtering with magnetic fields is that the relative movement of the process gas ions with respect to the magnetic field and the resulting velocity-dependent Lorentz force give rise to an asymmetry of the movement of the process gas ions. The ions accelerated toward the target with respect to the direction of the normal or perpendicular to the target surface.

This means that the angular distribution of the process gas ions impinging on the target surface is no longer symmetrical with regard to the normal to the target surface. Rather, a preferred direction is established in the direction of the path movement of the Lorentz deflection. This means that the process gas ions impinge on the target surface preferably in the direction of the path velocity or of the Lorentz deflection.

Accordingly, the removal of target constituents is also no longer symmetrical with respect to the normal to the target surface. The target constituents likewise rush away from the target surface preferably in the direction to the path velocity or Lorentz deflection. This leads to asymmetries during the application of material on the substrate surface as well, and thus to systematic faults when constructing micron scale structures causing uniformity problems.

Thus, a need still remains for a deposition system to be developed to resolve the uniformity problems. In view of the ever-increasing commercial competitive pressures, along with growing consumer expectations, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

SUMMARY

The embodiments of the present invention provide a method of operation of a deposition system including: adjusting a cathode; rotating a rotating shield below the cathode for exposing the cathode through a shroud below the cathode and through a shield hole of the rotating shield; and rotating a rotating pedestal for producing a material to form a carrier over the rotating pedestal, wherein the material having a non-uniformity constraint of less than 1% of a thickness of the material and the cathode having an angle between the cathode and the carrier.

The embodiments of the present invention provide deposition system, including: a cathode; a shroud below the cathode; a rotating shield below the cathode for exposing the cathode through the shroud and through a shield hole of the rotating shield; and a rotating pedestal for producing a material to form a carrier over the rotating pedestal, wherein the material having a non-uniformity constraint of less than 1% of a thickness of the material and the cathode having an angle between the cathode and the carrier.

Certain embodiments of the invention have other steps or elements in addition to or in place of those mentioned above. The steps or the elements will become apparent to those skilled in the art from a reading of the following detailed description when taken with reference to the accompanying drawings.

BRIEF DESCRIPTION OF THE DRAWINGS

FIG. 10 is a cross-sectional view of one of the cathodes.

FIG. 11 is a cross-sectional view of another portion of one of the cathodes.

FIG. 12 is a cross-sectional view of the telescopic cover ring.

FIG. 19 is a cross-sectional view of the shrouds in the deposition system.

FIG. 20 is a top isometric view of one of the shrouds.

FIG. 21 is a cross-sectional view illustrating one of the shrouds and the rotating shield.

FIG. 22 is another cross-sectional view illustrating one of the shrouds over the rotating shield for capturing the materials of FIG. 1 from one of the cathodes.

DETAILED DESCRIPTION

Figures 1, 2:
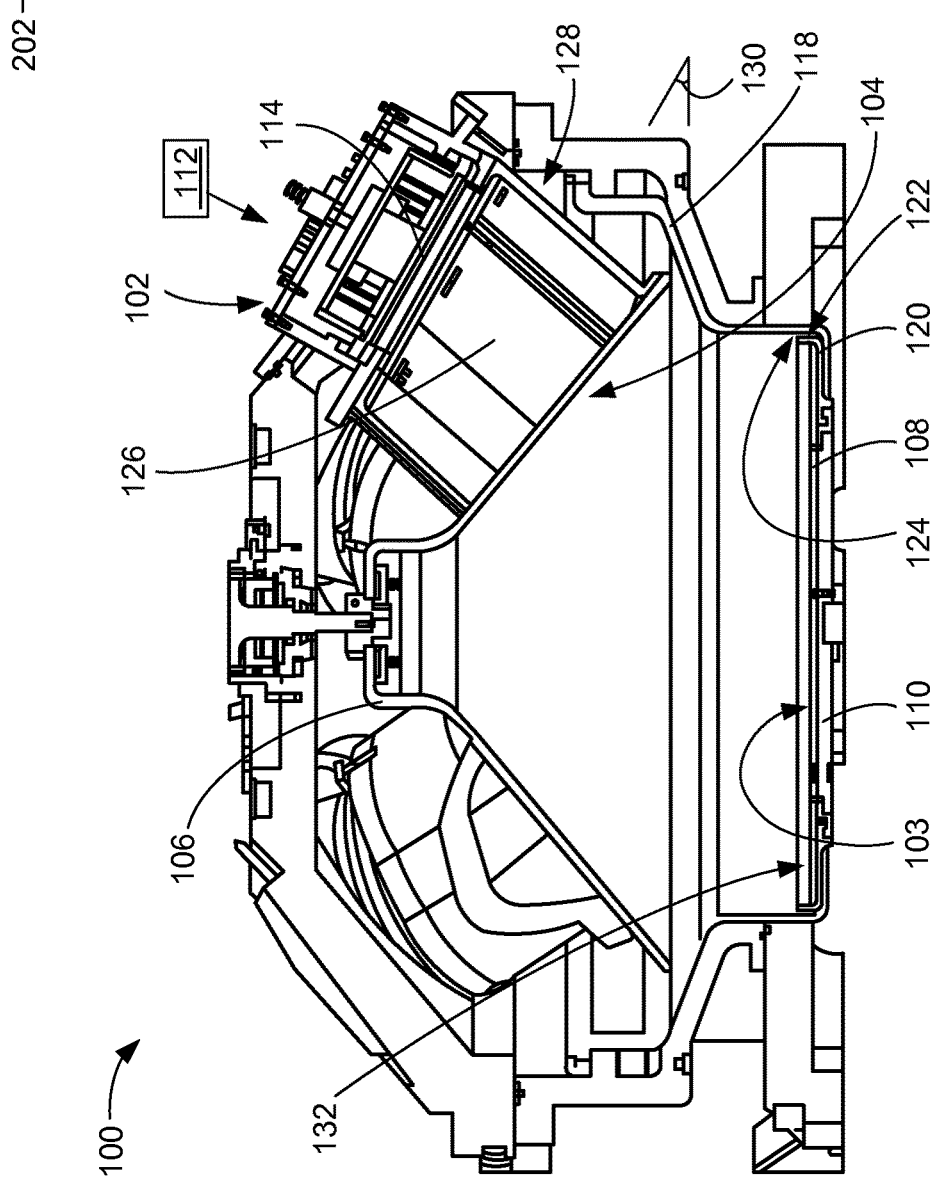
FIG. 1 is a cross-sectional view of a deposition system 100 taken along line 1-1 of FIG. 6 in an embodiment of the present invention.
FIG. 2 is an example table of a memory device with a stack of layers of the materials.

The following embodiments are described in sufficient detail to enable those skilled in the art to make and use the invention. It is to be understood that other embodiments would be evident based on the present disclosure, and that system, process, or mechanical changes may be made without departing from the scope of the embodiments of the present invention.

In the following description, numerous specific details are given to provide a thorough understanding of the invention. However, it will be apparent that the invention may be practiced without these specific details. In order to avoid obscuring the embodiments of the embodiments of the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered second embodiment, first embodiment, etc. as a matter of descriptive convenience and are not intended to have any other significance or provide limitations for the embodiments of the present invention.

For expository purposes, the term "horizontal" as used herein is defined as a plane parallel to a plane or a surface of a target, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is contact between elements. The term "directly on" means that there is direct physical contact between one element and another element without an intervening element.

The term "processing" as used herein includes deposition of material or photoresist, patterning, exposure, development, etching, cleaning, and/or removal of the material or photoresist as required in forming a described structure.

Figure 6:
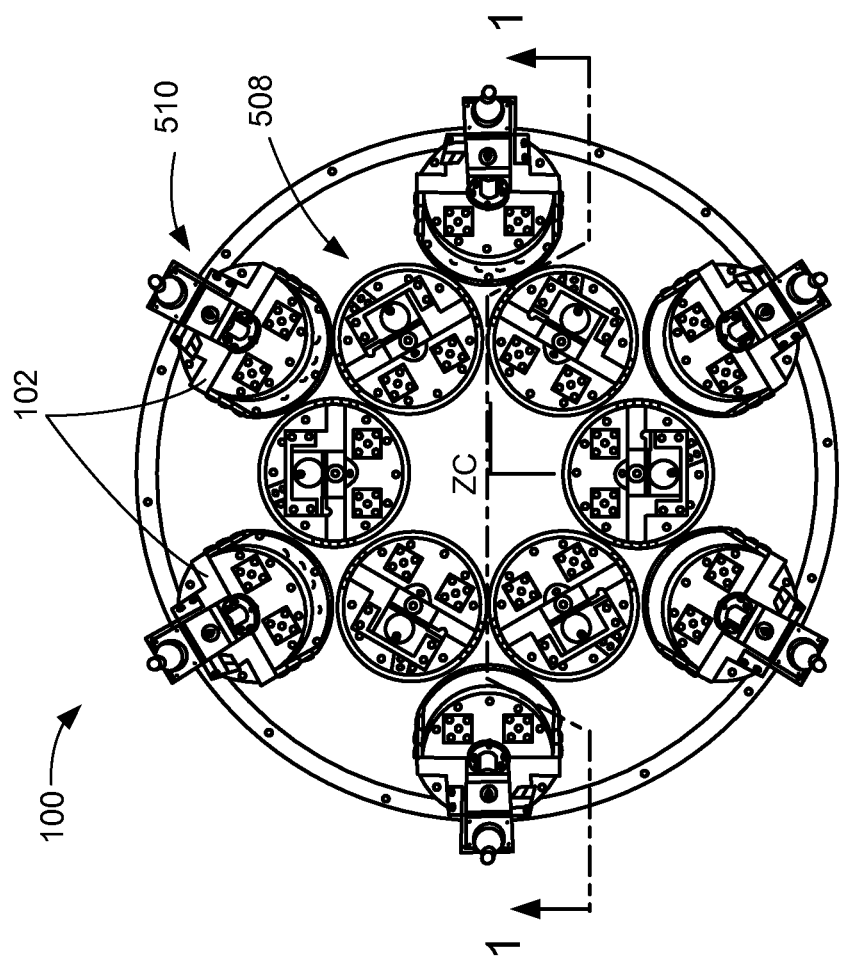
FIG. 6 is a top view of a portion of the deposition system.

Referring now to FIG. 1, therein is shown a cross-sectional view of a deposition system 100 taken along line 1-1 of FIG. 6 in an embodiment of the present invention. The cross-sectional view depicts an example with design details of a deposition chamber or the deposition system 100.

FIG. 1 depicts cathodes 102 that can be used for sputtering different materials 103. The cathodes 102 are shown or exposed through shield holes 104 of a rotating shield 106, which can be over a carrier 108 on a rotating pedestal 110. There may be only one carrier 108 over or on the rotating pedestal 110.

The carrier 108 is a structure having a semiconductor material used for fabrication of integrated circuits. For example, the carrier 108 can represent a semiconductor structure including a wafer. The rotating shield 106 is formed with the shield holes 104 so that the cathodes 102 can be used to deposit the materials 103 through the shield holes 104.

A power supply 112 can be applied to the cathodes 102. The power supply 112 can include a direct current (DC) or radio frequency (RF) power supply. Angular positions of the cathodes 102 can be changed to any angles. This design allows coaxial feed for power, such as the power supply 112, to the cathodes 102.

The rotating shield 106 can expose one of the cathodes 102 at a time and protect other cathodes 102 from cross-contamination. The cross-contamination is a physical movement or transfer of a deposition material from one of the cathodes 102 to another of the cathodes 102. The cathodes 102 are positioned over targets 114. A design of a chamber can be compact. The targets 114 can have any sizes. For example, each of the targets 114 can include a diameter of approximately 4 inches (") to 6".

There are performance advantages of a design using the rotating pedestal 110. The advantages can include using any number of different materials in one chamber, whereas in previous designs without the rotating pedestal 110, there can be only two materials.

Features of the deposition system 100 include a single rotating shield, such as the rotating shield 106, without rotating components hidden behind the rotating shield 106. The rotating shield 106 provides an advantage of improving particle performance.

In FIG. 1, the carrier 108 can be on the rotating pedestal 110, which can vertically move up and down. Before the carrier 108 moves out of the chamber, the carrier 108 can move below a conical shield 118. A telescopic cover ring 120 is shown as a structure that is on top of the conical shield 118. Then, the rotating pedestal 110 can move down, and then the carrier 108 can be lifted up with a robotic arm before the carrier 108 moves out of the chamber.

When the materials 103 are sputtered, the materials 103 can be kept inside and not outside of the conical shield 118. In order to do that, the telescopic cover ring 120 can include a ring portion 122 that curves up and has a predefined thickness. The telescopic cover ring 120 can also include a predefined gap 124 and a predefined length with respect to the conical shield 118. Thus, the materials 103 may not be below the rotating pedestal 110 thereby eliminating contaminants from spreading to the carrier 108.

FIG. 1 depicts individual shrouds 126. Each of the shrouds 126 has a shroud rotation 128 to provide the cathodes 102 at an angle 130 of approximately 30 to 50 degrees. Different values of the angle 130 provide different uniformity profiles on a surface of the carrier 108. The angle 130 is measured between a plane of one of the targets 114 and a plane of the carrier 108.

The shrouds 126 can be designed such that a majority of the materials 103 from the targets 114 that does not deposit on the carrier 108 is contained in the shrouds 126, hence making it easy to reclaim and conserve the materials 103. This also enables one of the shrouds 126 for each of the targets 114 to be optimized for that target to enable better adhesion and good defect performance. For example, the majority can include at least 80% of one of the materials 103.

The shrouds 126 can be designed to minimize cross-talk or cross-target contamination between the cathodes 102 and to maximize the materials 103 captured for each of the cathodes 102. Therefore, the materials 103 from each of the cathodes 102 would just be individually captured by one of the shrouds 126 over which the cathodes 102 are positioned. The captured materials may not land on the carrier 108.

The carrier 108 can be coated with uniformity 132 of the materials 103 deposited on a surface of the carrier 108 using the deposition materials including a metal from the targets 114 over the shrouds 126. Then, the shrouds 126 can be taken through a recovery process. The recovery process not only cleans the shrouds 126 but also recovers a residual amount of the deposition materials remained on or in the shrouds 126. The uniformity 132 relates to how evenly or smoothly the materials 103 are deposited at a predetermined number of locations on the surface of the carrier 108.

For example, there may be platinum on one of the shrouds 126 and then iron on another of the shrouds 126. Since platinum is a precious metal that is more valuable than iron, the shrouds 126 with platinum can be sent out for the recovery process.

It has been discovered that adjusting one of the cathodes 102 at a time for changing the angle 130 improves the uniformity 132 at the surface of the carrier 108.

It has also been discovered that rotating the rotating shield 106 for exposing each of the cathodes 102 through the shroud 126 and one of the shield holes 104 improves reliability without the cross-contamination between the cathodes 102.

It has further been discovered that rotating the rotating pedestal 110 improves the uniformity 132.

Referring now to FIG. 2, therein is shown an example table of a memory device 202 with a stack of layers 204 of the materials 103. The stack of the layers 204 can be formed or produced to manufacture or form the carrier 108 of FIG. 1 for the memory device 202. The materials 103 can be deposited using the deposition system 100 of FIG. 1 of the embodiments of the present invention. Although there are eleven of the layers 204 shown in FIG. 2, there can be any number of the layers 204.

For example, the memory device 202 can include any storage component including a Magnetic Random Access Memory (MRAM). The MRAM can represent a memory technology at sub-40 nanometer (nm) nodes for embedded application as an example. The deposition system 100 for the MRAM can include factors described in paragraphs below.

The MRAM can include an eleven-layer stack as shown in FIG. 2, as an example, with 6 to 7 unique or different materials. Therefore, the deposition system 100 can be capable of depositing different materials 103 in a single chamber.

The deposition system 100 can include co-sputtering capabilities using radio frequency (RF) or direct current (DC) methods for metals, insulators, alloys, and Nitrides, as examples. A stack thickness of the stack can range from approximately 7 to 150 Angstroms with advantages of an extremely high non-uniformity (NU) constraint 206 of preferably less than 1% of a thickness of each of the layers 204 deposited, a sharp interface, a smooth film, a uniform orientation, and low damage. The extremely high NU constraint 206 improves the uniformity 132 of FIG. 1.

The factors above can be addressed with a uniquely designed multi-target or multi-cathode source as previously shown in FIG. 1 and subsequently shown in FIGS. 5-6. The multi-cathode source can include multiple of the cathodes 102 of FIG. 1. The multi-target or multi-cathode source can be mounted on or is designed based on a chamber body of the chamber. For example, the chamber can represent a PVD chamber.

The materials 103 can include any material including metal or insulator. As a specific example, the materials 103 can include Tantalum Nitride (TaN), Titanium Nitride (TiN), Ruthenium (Ru), Tantalum (Ta), Cobalt Iron Boron (CoFeB), Magnesium Oxide (MgO) or magnesia, Cobalt Iron (CoFe), Iridium Manganese metal (IrMn), Platinum Manganese (PtMn), or a combination thereof.

As another specific example, TaN or TiN, Ru, Ta, CoFeB, and MgO can be used as a hardmask, a top electrode, a capping layer, a free layer, and a tunnel oxide, respectively. As a further specific example, CoFeB, Ru, CoFe, IrMn or PtMn, can be used as a ferromagnetic, a coupling, a ferromagnetic, respectively. As a yet further specific example, Ru and Ta can be used as a bottom electrode and an adhesive or a seed, respectively.

As a specific example, TaN or TiN, Ru, Ta, CoFeB, and MgO can include a thickness of 75-100 nm, 5 nm, 5 nm, 1-2 nm, and 1-2 nm, respectively. As another specific example, CoFeB, Ru, CoFe, IrMn or PtMn, can include a thickness of 2-3 nm, 0.9 nm, 2-3 nm, and 7-20 nm, respectively. As a further specific example, Ru and Ta can include a thickness of 5-20 nm and 5 nm, respectively.

Figure 3:
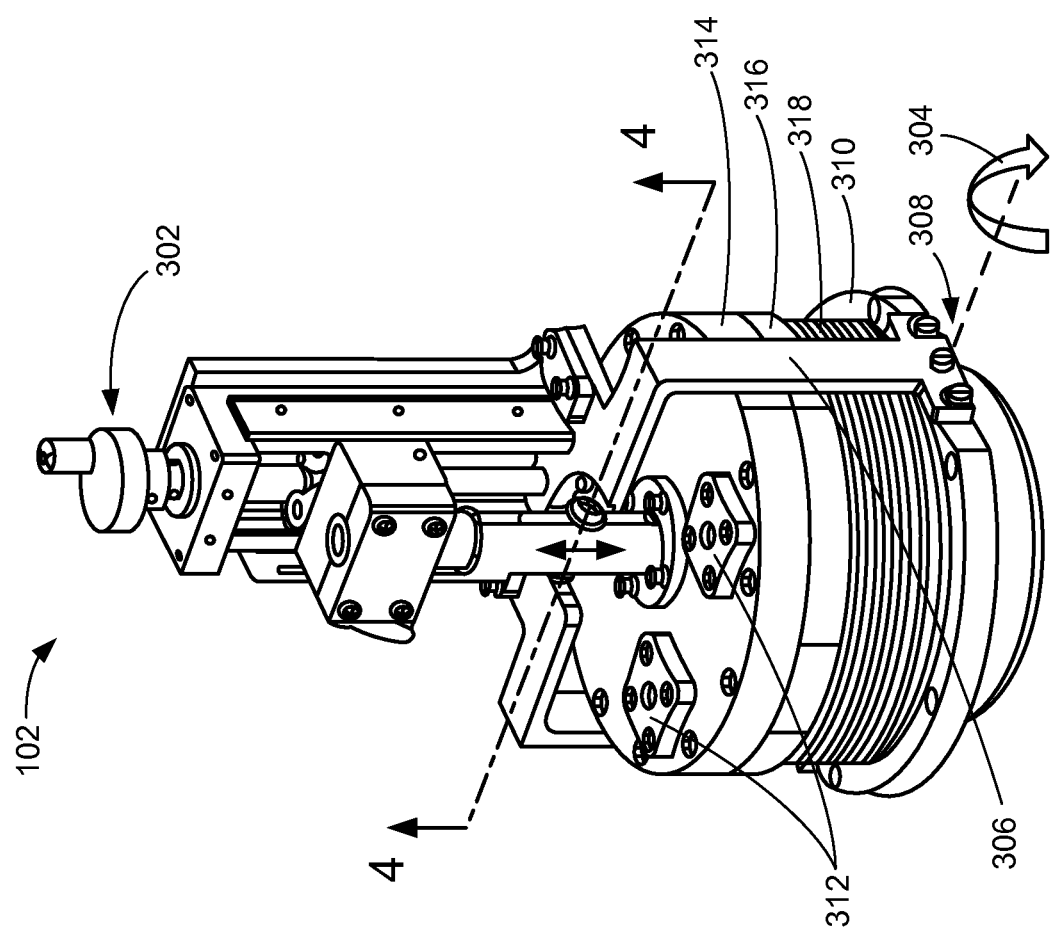
FIG. 3 is a top isometric view of one of the cathodes of the deposition system of FIG. 1.

Referring now to FIG. 3, therein is shown a top isometric view of one of the cathodes 102 of the deposition system 100 of FIG. 1. Currently, no such tool exists for multi-target sputtering using multiple of the cathodes 102, one of which is shown in the top isometric view. Thus, there has been an immediate need to design a multi-target source, such as a source with multiple of the cathodes 102 as shown in FIG. 1, while keeping design factors below in mind.

The multi-target source can be mounted on the chamber with a small footprint. For example, the multi-target source can be small such that the targets 114 of FIG. 1 can include a size or a diameter of 4 to 6 inches because of expensive materials and the multi-target source is capable of depositing at least 3 different materials in the single chamber, such as the chamber previously described. The multi-target source can include individual adjustments including a target-source height adjustment, an angular adjustment, and a magnet-target spacing adjustment mechanism to provide an extra knob 302 for fine-tuning a deposition process.

Work related to the deposition process has started with simulation, considering various conditions and probabilities including varying diameters of the targets 114, target-to-carrier spacing (horizontal, X and vertical, Y), a target-to-carrier angle or the angle 130 of FIG. 1, and a number of the targets 114 per source. The work also includes analyzing a set of simulation data and considering a design feasibility arrived following best conditions, as subsequently shown in FIG. 8, which provides a deposition non-uniformity with the extremely high NU constraint of 0.5%-2%.

For example, the deposition system 100 can include a set of 12 targets with 6 inner race targets and 6 outer race targets as subsequently shown in FIG. 6. Also for example, the targets 114, each with a diameter of 4.72", provide good NU values in accordance with the NU constraint and are realistic in accommodating 12 of the targets 114 on the chamber.

As an example, when considering 4.72" as a target diameter condition, an individual source, such as one of the targets 114, has been designed based on this condition to be as minimal as possible on an outer diameter footprint of the chamber. As a specific example, the outer diameter footprint can include a diameter of 7.7".

An angular adjustment mechanism 304 provides an angular movement to change the angular positions of the cathodes 102. The angular adjustment mechanism 304 can provide the angular positions by rotating a swing arm 306 of each of the cathodes 102 with respect to or based on a pivot point 308 to form the angle 130. The pivot point 308 is located at a bottom end of the swing arm 306 where the swing arm 306 is attached to a lower flange 310.

Water adapter blocks 312 can be mounted on a top plate 314. The top plate 314 can be over an upper flange 316, which together with the lower flange 310 provides upper and lower support structures for an outer bellow assembly 318.

Figure 4:
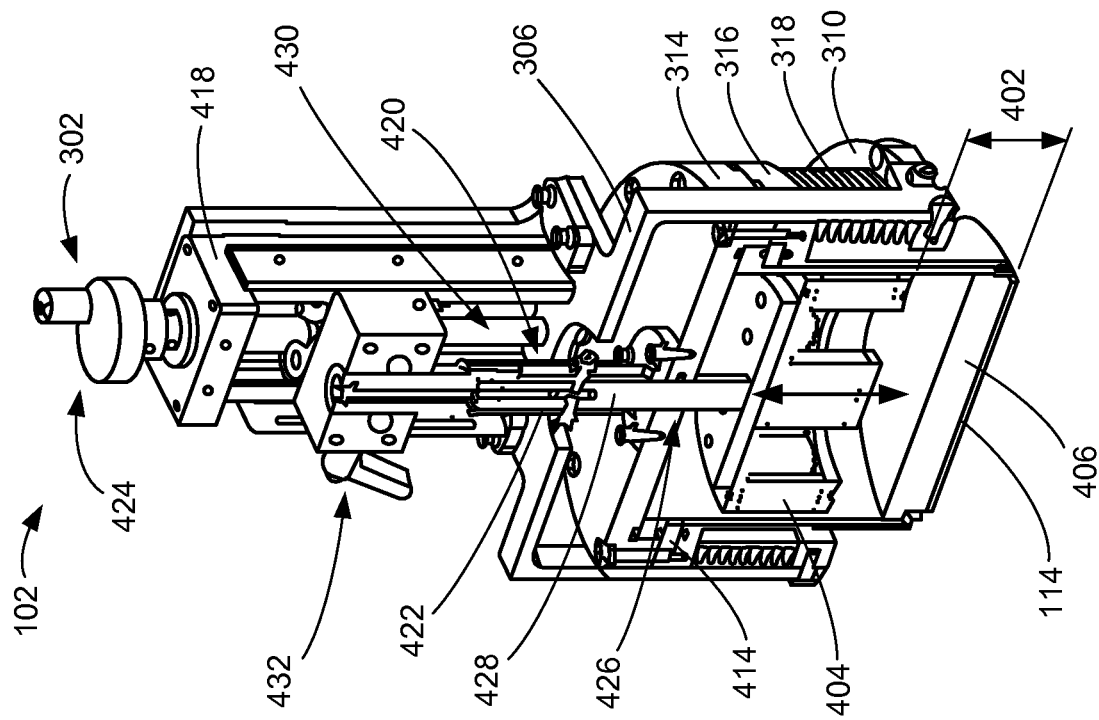
FIG. 4 is a cross-sectional view of one of the cathodes taken along line 4-4 of FIG. 3.

Referring now to FIG. 4, therein is shown a cross-sectional view of one of the cathodes 102 taken along line 4-4 of FIG. 3. The cross-sectional view depicts an individual target source or one of the cathodes 102.

FIG. 4 depicts an assembly of one of the cathodes 102, in which a magnet-to-target spacing 402 can be adjusted during the deposition process. The magnet-to-target spacing 402 is a distance between a magnet 404 of one of the cathodes 102 and one of the targets 114. The cathodes 102 can be manually or automatically adjusted. A sputtering angle or the angle 130 of FIG. 1 of the cathodes 102 can be changed while the cathodes 102 are still under a vacuum.

Each of the targets 114 can be bounded or mounted to a backing plate 406, which is similar to a structure with a vessel shape, the outer bellow assembly 318 having the lower flange 310 and the upper flange 316. For example, both of the lower flange 310 and the upper flange 316 can be welded with each other using flexible bellows with a conductive material including stainless steel (SST).

Each of the targets 114 can be mounted inside the upper flange 316. A grounded shield can be formed with the lower flange 310 and the upper flange 316 grounded. A nonconductive ring 414 helps to electrically isolate the grounded shield from the targets 114, which can be live due to connection with the power supply 112 of FIG. 1.

For example, the nonconductive ring 414 can include an insulation material, such as ceramic or clay. The grounded shield is a part that is mounted on the inside of the conical shield 118 of FIG. 1.

The top plate 314 can be bolted from a top surface of the top plate 314 to compress all O-rings including the nonconductive ring 414 to hold the targets 114 in place. As such, the vacuum as well as water leak sealing can be achieved. Each source or each of the cathodes 102 can include a number of manual motion mechanisms described below for improving the uniformity 132 of FIG. 1. For example, the bolted plate can include insulation, such as a type of an insulator material similar to fiberglass.

The manual motion mechanisms can include the angular adjustment mechanism 304 of FIG. 3 using the swing arm 306 that pivots around the lower flange 310. The swing arm 306 holds a linear slide 418 over the swing arm 306 and at a top portion of each of the cathodes 102. The swing arm 306 can adjust the targets 114 for +/−5 degrees with respect to the carrier 108 of FIG. 1. This flexibility allows fine-tuning the NU profile on a top surface of the carrier 108.

The manual motion mechanisms can include a source lift mechanism 420 with the swing arm 306 holding the linear slide 418 at the top portion of each of the cathodes 102. The linear slide 418 holds a source or the materials 103 of FIG. 1 with a hollow shaft 422. The linear slide 418 provides a source movement of the materials 103 along the hollow shaft 422 as shown by a bidirectional vertical arrow.

The manual motion mechanisms can include a knob adjustment mechanism 424 with a manual adjustment knob or the knob 302 at the top portion of each of the cathodes 102 to provide a linear actuation. The knob adjustment mechanism 424 is designed to achieve a total stroke length. The total stroke length can include any numerical value. For example, the total stroke length can be 2.5".

The manual motion mechanisms can include a magnet-to-target adjustment mechanism 426 to adjust the magnet-to-target spacing 402. A permanent magnet can be placed inside the source. An inner shaft 428 holds the magnet 404 inside the hollow shaft 422. The inner shaft 428 can include any structure for holding the magnet 404. As a specific example, the inner shaft 428 can include a Delrin® shaft.

An adjustment screw 430 on top of each of the cathodes 102 provides a linear adjustment of the magnet-to-target spacing 402. A side locking screw 432 holds the magnet 404 in position after achieving a predetermined value of the magnet-to-target spacing 402. For example, a total adjustable stroke length for the magnet-to-target spacing 402 can be 1".

Figure 5:
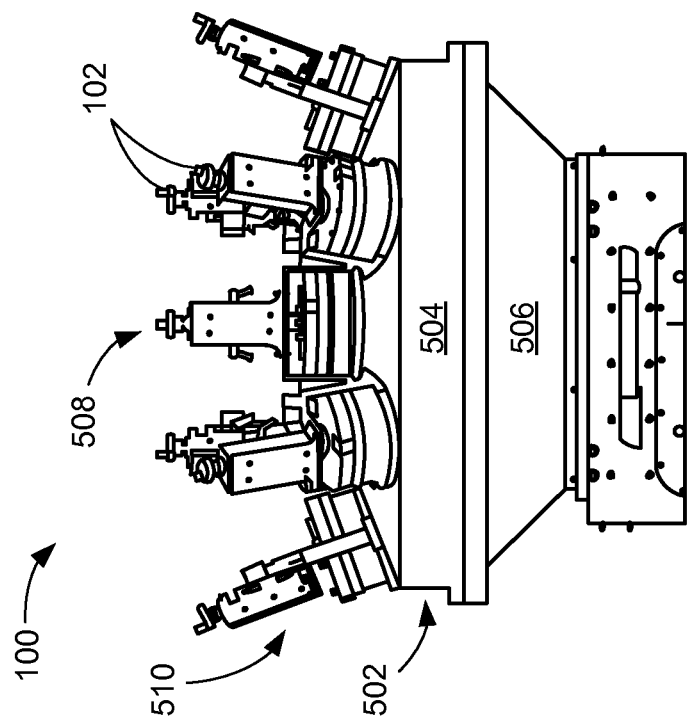
FIG. 5 is a side view of a portion of the deposition system.

Referring now to FIG. 5, therein is shown a side view of a portion of the deposition system 100. The deposition system 100 can include a multi-cathode chamber 502. The side view depicts an assembly with the multi-cathode chamber 502 and the cathodes 102.

For example, the multi-cathode chamber 502 can represent a multi-cathode PVD chamber. Also for example, the deposition system 100 can include a multi-target PVD source design for an MRAM application.

A single monolith adapter or a source adapter 504 holds multiple of the cathodes 102 in place. For example, the source adapter 504 can hold any number of the cathodes 102. As a specific example, the source adapter 504 can hold 12 of the cathodes 102.

The source adapter 504 can be mounted onto a conical adapter 506. Both of the source adapter 504 and the conical adapter 506 along with the processes described above provide the multi-target source, as shown in FIGS. 4-5.

The multi-cathode chamber 502 can include multiple of the cathodes 102 for PVD and puttering. Each of the cathodes 102 can be connected to the power supply 112 of FIG. 1 including DC or RF. The cathodes 102 can have any number of different diameters. For example, there can be two of the diameters.

There can be a varying amount of the materials 103 of FIG. 1 by varying the power into the cathodes 102. Varying the power can control the uniformity 132 of FIG. 1 of the materials 103, as subsequently shown and described by simulation results. The uniformity 132 can further be achieved by controlling the rotating pedestal 110 of FIG. 1. Each of the cathodes 102 can apply different materials or the materials 103.

There can be an inner ring 508 and an outer ring 510 of the cathodes 102. These rings can also be called races. The cathodes 102 can be in the inner ring 508, the outer ring 510, or a combination thereof. The purpose of having the inner ring 508 and the outer ring 510 is to achieve a high level of the uniformity 132 without rotating the carrier 108 of FIG.

1. The high level of the uniformity 132 is based on the non-uniformity (NU) constraint described above.

It has been discovered that applying the power supply 112 using either a direct current (DC) or a radio frequency (RF) power supply provides the high level of the uniformity 132.

It has also been discovered that applying different materials 103 to the cathodes 102 in the same chamber, such as the multi-cathode chamber 502, improves reliability by eliminating any cross-contamination between the cathodes 102.

Referring now to FIG. 6, therein is shown a top view of a portion of the deposition system 100. The top view depicts the inner ring 508 and the outer ring 510 with multiple of the cathodes 102.

Figure 7:
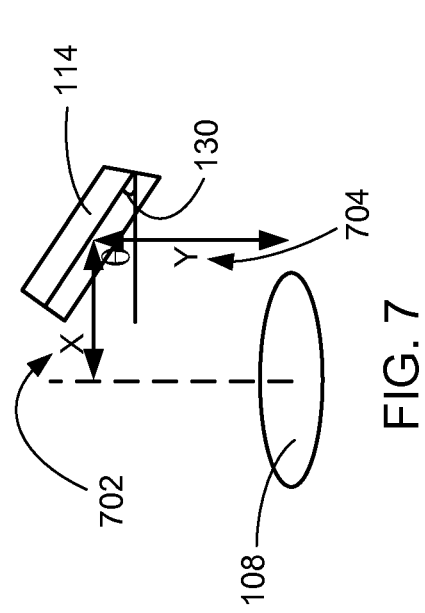
FIG. 7 is a diagram of the angle.

Referring now to FIG. 7, therein is shown a diagram of the angle 130. The diagram is used for simulation. Positions of the targets 114 and the carrier 108 are based on the angle 130, denoted as θ, and the target-to-carrier spacing using a horizontal distance 702 and a vertical distance 704. The horizontal distance 702 and the vertical distance 704 are denoted as distances X and Y, respectively. The distances X and Y are measured between centers of the targets 114 and the carrier 108. The horizontal distance 702 and the vertical distance 704 can represent a horizontal gap and a vertical height, respectively.

For illustrative purposes, the targets 114 in the cathodes 102 of FIG. 1 of the inner ring 508 of FIG. 5 can be positioned at 0 degree and the distances X and Y of 8" and 13", respectively. Also for illustrative purposes, the targets 114 in the cathodes 102 of the outer ring 510 of FIG. 5 can be positioned at 15 degrees and the distances X and Y of 12.9" and 12", respectively.

The angle 130 can include an approximate range of 30 degrees to 50 degrees. The horizontal distance 702 can include an approximate range of 6" to 15". The vertical distance 704 can include an approximate range of 9" to 12".

Larger values of the horizontal distance 702 and the vertical distance 704 provide better or less non-uniformity. However, the larger values provide less deposition rates and hence material efficiency. The angle 130 depends on a sputtering profile of the materials 103 of FIG. 1. This is a function of a sputtered material or a sputtering atom including Argon (Ar), Neon (Ne), and Xenon (Xe).

Figure 8:
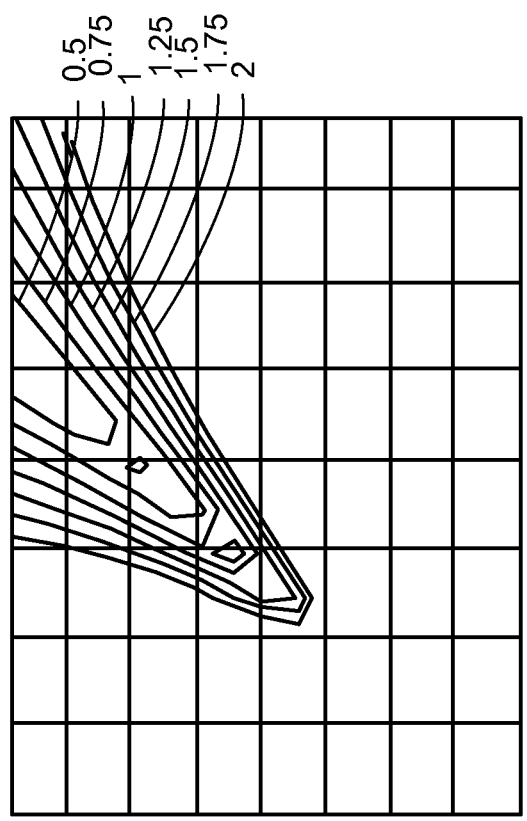
FIG. 8 is a graph illustrating the simulation results of the deposition system of FIG. 1.

Referring now to FIG. 8, therein is shown a graph illustrating the simulation results of the deposition system 100 of FIG. 1. The graph is based on the simulation data under the best conditions. The graph shows the simulation results of the targets 114 of FIG. 1 of the cathodes 102 of FIG. 1 in inner and outer loops, such as the inner ring 508 of FIG. 5 and the outer ring 510 of FIG. 5.

The simulation results in FIG. 8 show that, for cosine values of 0 degree and 15 degree, a non-uniformity value is 0.5-2% with 4 of the carriers 108 of FIG. 1 per each of the materials 103 of FIG. 1. The multi-target source with 12 of the targets 114 along with a process using the manual motion mechanisms including the knob adjustment mechanism 424 of FIG. 4 achieves closer to the simulated results. This new unique multi-target source can enable entrance into new memory market and exploration of new opportunities including MRAM.

The multi-target source can be used with the cathodes 102 having the same type of the materials 103. The materials 103 can be sputtered on the carrier 108 with improved level of the uniformity 132 of FIG. 1 without having to protect the carrier 108 as long as multiple of the cathodes 102 include the same materials 103.

The graph shows the horizontal distance 702 and the vertical distance 704 in inches on the X- and Y-axes, respectively. As an example in the inner ring 508, the non-uniformity value can be less than or equal to approximately 0.5% when the horizontal distance 702 is approximately 11"-16" and the vertical distance 704 is at least approximately 14".

As another example in the outer ring 510, the non-uniformity value can be less than or equal to approximately 0.5% when the horizontal distance 702 is approximately 11"-19" and the vertical distance 704 is at least approximately 12". As the horizontal distance 702 and the vertical distance 704 change to values outside of the approximate ranges above, the non-uniformity value can increase and become greater than 0.5%.

Figure 9:
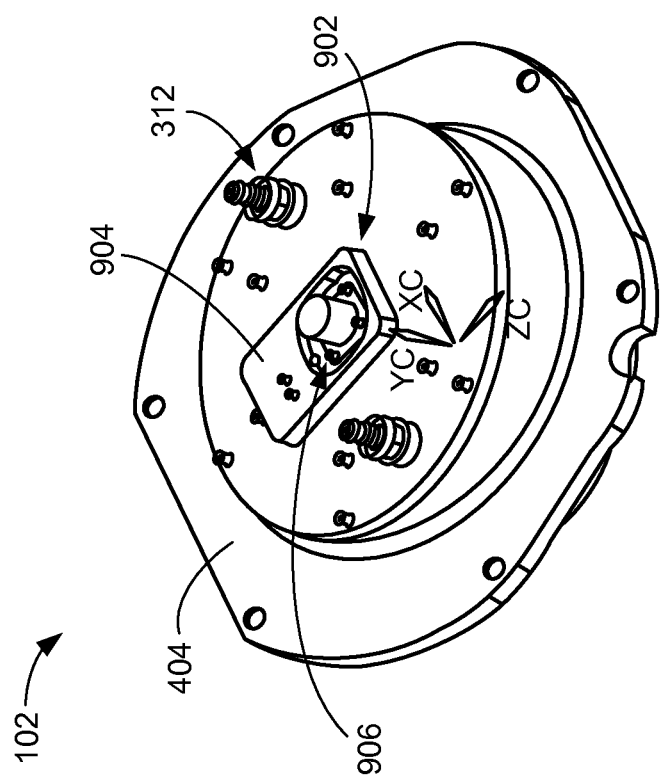
FIG. 9 is a top isometric view of a portion of one of the cathodes.

Referring now to FIG. 9, therein is shown a top isometric view of a portion of one of the cathodes 102. One of the cathodes 102 can be rotated approximately 30-50 degrees as shown. FIG. 9 depicts the magnet 404 all around a connector 902.

The connector 902 prevents the power supply 112 of FIG. 1 including an RF power supply from being turned on when the connector 902 is disconnected. For example, the connector 902 can be an interlock connector or a type of coaxial connectors used to transmit RF.

There can be any number of fittings function as the water adapter blocks 312 on both sides of the connector 902. The water adapter blocks 312 provide water into one of the water adapter blocks 312 and out of another the water adapter blocks 312 to supply water to keep an assembly of one of the targets 114 of FIG. 1 in the cathodes 102 cool when the power supply 112 is supplied to the cathodes 102.

Each of the cathodes 102 can include a source connector 904 adjacent to and directly in between the water adapter blocks 312. The source connector 904 can represent a source quick connect (SQC) connector. The source connector 904 can include a source groove 906.

Referring now to FIG. 10, therein is shown a cross-sectional view of one of the cathodes 102. The cross-sectional view depicts one of the cathodes 102 rotated 40 degrees.

The magnet 404 can include a larger magnet 1002. For example, the larger magnet 1002 can represent a magnetron. The larger magnet 1002 can include cylindrical structures that function as magnets. The magnet 404 can include an interior magnet 1004 in the center of the magnet 404 to form a close loop magnetron used for the targets 114.

The larger magnet 1002 is larger or having a diameter greater than a diameter of the interior magnet 1004. The larger magnet 1002 surrounds the interior magnet 1004.

Each of the cathodes 102 can include a source sensor or a source housing structure 1006 that houses a magnet sub-assembly, such as the magnet 404. The source housing structure 1006 can include any material including a conductive material such as aluminum. The source housing structure 1006 can include an insulation housing structure 1008 to provide the housing using an insulator material including Ultem.

The power supply 112 of FIG. 1 can be supplied through the magnet 404 to the targets 114. There can be a metal connector 1012 connecting to the power supply 112 through the source connector 904. There can be a center feed of the power supply 112 into the cathodes 102. For example, the metal connector 1012 can include an electrically conductive material including brass.

A return current for the cathodes 102 through magnetron plasma can flow back through a C-hook 1014. The current can then flow back to the source housing structure 1006 through the source groove 906 of FIG. 9 to provide a good return path to the power supply 112.

Insulator rings, such as a lower insulator ring 1016 and an upper insulator ring 1018, can include coaxial seal O-rings, such as a lower o-ring 1020 and an upper o-ring 1022. The lower insulator ring 1016 can be partially directly below the upper insulator ring 1018. The lower insulator ring 1016 can include a width greater than a width of the upper insulator ring 1018.

The lower o-ring 1020 can be directly below the upper o-ring 1022. The lower o-ring 1020 and the upper o-ring 1022 can be directly on bottom and top surfaces of the upper insulator ring 1018. The lower o-ring 1020 and the upper o-ring 1022 can be directly below and directly above the upper insulator ring 1018, respectively.

The lower insulator ring 1016, the upper insulator ring 1018, the lower o-ring 1020, and the upper o-ring 1022 can surround the larger magnet 1002 and the insulation housing structure 1008 for providing sealant from the atmosphere. The lower o-ring 1020 provides sealant from the water.

Referring now to FIG. 11, therein is shown a cross-sectional view of another portion of one of the cathodes 102. The cross-sectional view depicts differential pumping details of the deposition system 100 of FIG. 1.

FIG. 11 depicts how the assembly of one of the targets 114 of FIG. 1 differentially pumps. When using O-rings, such as an inner O-ring 1102 and an outer O-ring 1104, the vacuum can be pulled on one side of the O-rings and the other side can be exposed to the atmosphere.

Then, a pressure across the O-rings can be 760 torrs, as an example, as atmospheric pressure. Small molecules can permeate through the O-rings, causing the pressure to increase in the chamber. The permeation of the molecules is proportional to the pressure across the O-rings.

The inner O-ring 1102 is closer to the center of each of the cathodes 102 than the outer O-ring 1104 to the center. The inner O-ring 1102 and the outer O-ring 1104 can be within the conical adapter 506 at a top surface of the conical adapter 506. The inner O-ring 1102 and the outer O-ring 1104 can be below a top adapter or the source adapter 504. The conical adapter 506 surrounds the conical shield 118.

In between these O-rings, there can be a connection shown as a center groove 1106 in or below the top adapter down to differential pumping ports 1108 at a side of the conical adapter 506. Such connection can be pumped with a pressure, which can be in the millitorr ranges. The O-rings can have pressure differences between atmosphere and port pressures, and then port and chamber pressures. This shows pressures between two of the O-rings.

As shown in FIG. 11, the inner O-ring 1102 that is to the right of the differential pumping ports 1108 and closer to the chamber than the outer O-ring 1104 can be the most critical O-ring compared to the outer O-ring 1104. The inner O-ring 1102 can represent a vacuum O-ring. The inner O-ring 1102 can have a very small pressure, which can be in an approximate range of a nano-torr to a milli-torr instead of a range of a nano-torr to 760 milli-torrs or 1000 milli-torrs. This provides an advantage of significant reduction of a pressure across the vacuum O-ring by an order of almost 3-6 or up to 12 orders of magnitude.

Referring now to FIG. 12, therein is shown a cross-sectional view of the telescopic cover ring 120. The cross-sectional view depicts the carrier 108 in line with a slit valve top face 1201.

FIG. 12 depicts a chamber body 1202, on which the conical adapter 506 is mounted, and an opening 1204 shown on a right wall of the chamber body 1202. The opening 1204 is a slit valve, through which the carrier 108 enters the chamber. The top of the opening 1204 is in line with the top of the rotating pedestal 110 of FIG. 1, which is where the carrier 108 sits.

The telescopic cover ring 120 is designed to provide for a telescopic deposition to cover the carrier 108 with the materials 103. Such telescopic covering allows increased stroke and thus increase spacing for the targets 114 of FIG. 1 to effectively sputter the materials 103 onto the carrier 108.

A deposition ring 1206 can be below and in direct contact with the telescopic cover ring 120. An intermediate piece or an intermediate ring 1208 can be over the deposition ring 1206 and directly on the conical shield 118. The materials 103 can be deposited on the carrier 108 on the left of FIG. 12. The deposition ring 1206 is partially shown as a ring-shaped part that is immediately adjacent to the carrier 108.

The telescopic cover ring 120 is shown as an L-shape structure rotated counter-clockwise in the middle of FIG. 12. The telescopic cover ring 120 can be adjacent and to the left of a portion of the conical shield 118, which can be stationary. The intermediate ring 1208 is shown as an L-shape structure inverted and immediately above the conical shield 118.

The telescopic cover ring 120 can move upward to pick up the intermediate ring 1208 to provide a large or extended labyrinth that continues. First, the labyrinth is created between the telescopic cover ring 120 and the portion of the conical shield 118. Then after a certain predetermined time of travel by the telescopic cover ring 120, the labyrinth continues with the intermediate ring and the conical shield 118. Thus, such long telescopic design allows a very long labyrinth or long stroke to provide the increased stroke previously described above.

Figure 13:
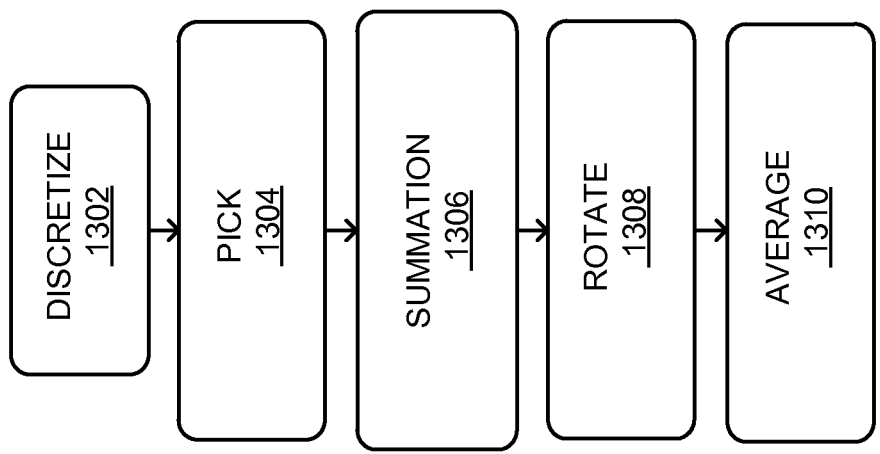
FIG. 13 is a flow chart of the simulation of deposition profiles.

Referring now to FIG. 13, therein is shown a flow chart of the simulation of deposition profiles. The flow chart depicts the simulation of MRAM. The flow chart describes a model used in the simulation. For example, the model is for the carrier 108 of FIG. 1 having geometry with a radius of 0.15 meter (m), a rectangular target, and 100% neutral emission using cosine emission of sputtered species from the targets 114 of FIG. 1. The geometry is shown by labels X, Y, and $\theta$ in FIG. 7.

In the model described above, the non-uniformity (NU) value can be plotted based on a 49-point NU and a 2-millimeter (mm) edge exclusion. The deposition process on 49-point locations has been calculated from the model. NU can be defined as a standard deviation of a number of points and divided by an average deposition. In this case, the cosine emission is assumed, the angle 130 of FIG. 1 ranges from 0 to 65 degrees, and the horizontal distance 702 of FIG. 7 and the vertical distance 704 of FIG. 7 vary from approximately 4"-19".

The flow chart depicts a discretize block 1302, a pick block 1304, a summation block 1306, a rotate block 1308, and an average block 1310. The discretize block 1302 discretize the targets 114 into a number of differential elements. For example, there can be 10×10 of the differential elements.

The pick block 1304 picks a point (r, $\theta$) on the carrier 108. The pick block 1304 calculates a view factor from each of the elements on the targets 114 to a point on the carrier 108.

The summation block 1306 calculates a summation of deposition thicknesses at the point (r, $\theta$) due to sputtering from every element on the targets 114. This procedure repeats for all points on the carrier 108. The deposition thicknesses will be further described below.

The rotate block 1308 rotates the carrier 108 by various degrees. For example, the carrier 108 can be rotated by 120 or 240 degrees to simulate second and third targets. The average block 1310 calculates an averaged deposition on the carrier 108 by averaging results from 0, 120, and 240 degrees rotation of the carrier 108.

Figure 14:
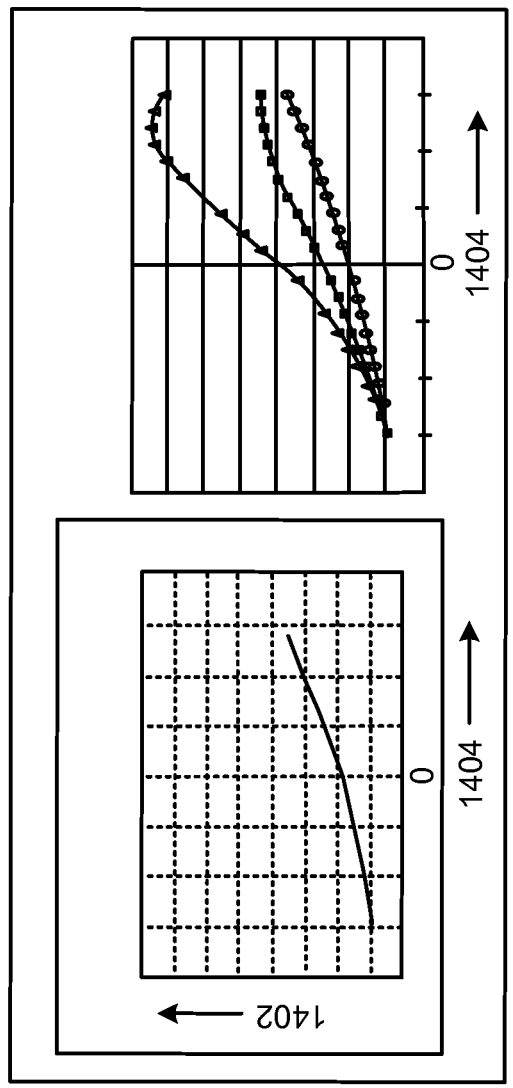
FIG. 14 is a plot illustrating a validation with a simulation model.

Referring now to FIG. 14, therein is shown a plot illustrating a validation with a simulation model. For example, the simulation can be an Ansys 3-dimentional (3D) model.

The graph shows a deposition thickness 1402 as a function of a radius 1404 of the carrier 108 of FIG. 1. The deposition thickness 1402 shown in the graph can be normalized. The deposition can be performed across the carrier 108 when the carrier 108 is not rotated.

The deposition thickness 1402 is measured from one end of the carrier 108 to another end of the carrier 108. The deposition thickness 1402 is measured at the center of the carrier 108. Then, the deposition thickness 1402 is subtracted by 6 for one end of the carrier 108 and added by 6 for another end of the carrier 108.

A left graph and a bottom curve on a right graph of the plot show that there is an excellent match between a matlab code and the simulation model. The bottom curve shows a good level of the uniformity 132 of FIG. 1 because an ideal graph shows a linear line. Upper curves above the bottom curve on the right graph show that the uniformity 132 is worst when the horizontal distance 702 of FIG. 7 and the vertical distance 704 of FIG. 7 increase compared to the bottom curve.

Figure 15:
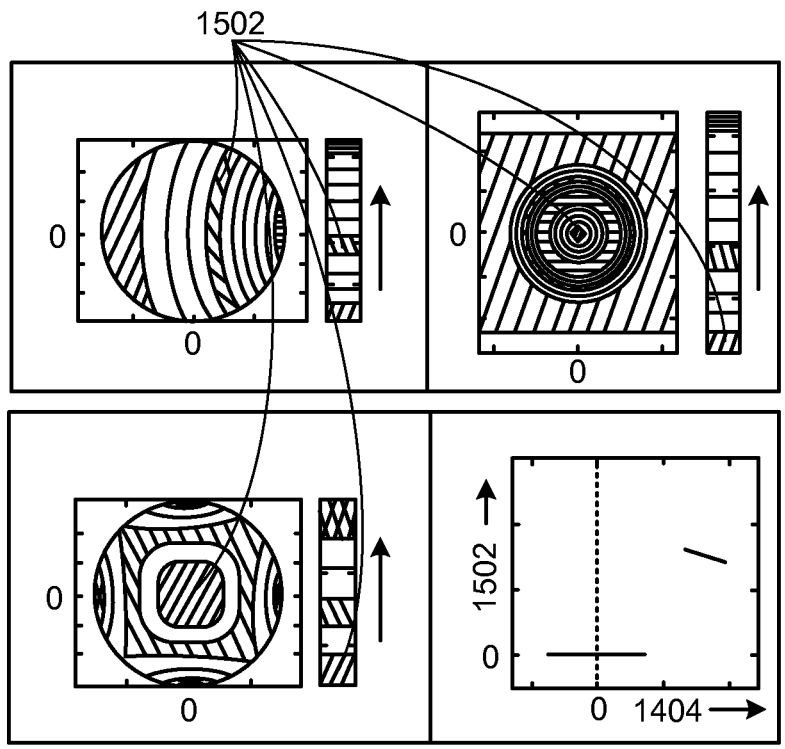
FIG. 15 is a graph illustrating a non-uniformity of the outer ring of FIG. 5.

Referring now to FIG. 15, therein is shown a graph illustrating a non-uniformity 1502 of the outer ring 510 of FIG. 5. The graph shows the non-uniformity 1502 based on multiple of the targets 114 of FIG. 1. The non-uniformity 1502 improves if the materials 103 of FIG. 1 used for the deposition process are the same. Thus, a location of the carrier 108 of FIG. 1 and a number of the targets 114 may not have to be determined.

In the upper left plot for only one of the targets 114, the non-uniformity 1502 improves as the radius 1404 of the carrier 108 decreases from right to left on the horizontal axis. In the lower left plot for a number of the targets 114, the non-uniformity 1502 improves at the center of the plot when the radius 1404 of the carrier 108 approaches 0.

In the upper right plot, the non-uniformity 1502 improves at the center of the plot when the radius 1404 of the carrier 108 approaches 0. In the lower right plot, the non-uniformity 1502 improves when the radius 1404 of the carrier 108 approaches 0. For the inner ring 508 of FIG. 5, the non-uniformity 1502 improves as the radius 1404 of the carrier 108 increases from 0.

Figure 16:
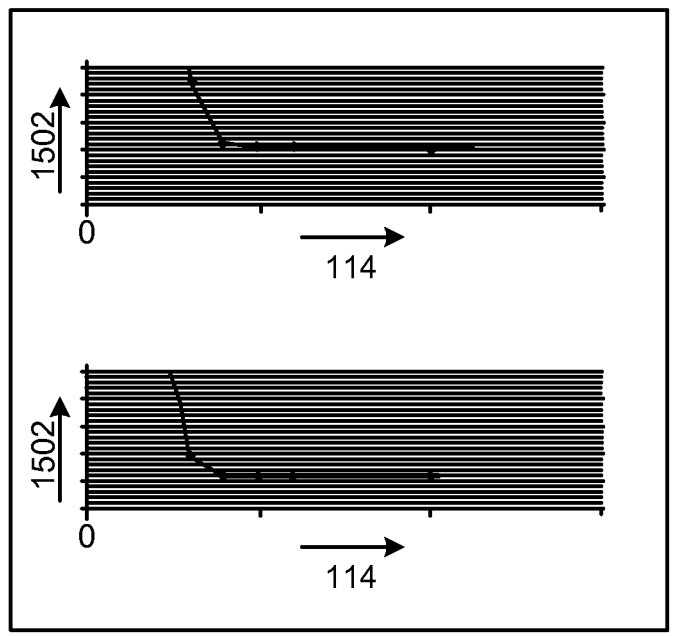
FIG. 16 is a graph illustrating an effect of a number of targets on the non-uniformity.

Referring now to FIG. 16, therein is shown a graph illustrating an effect of a number of the targets 114 on the non-uniformity 1502. In the upper plot, the non-uniformity 1502 improves as the number of the targets 114 increases up to 10 of the targets 114, as an example. In the lower plot, the non-uniformity 1502 improves as the number of the targets 114 increases up to 10 of the targets 114, as an example.

It has been noted that more than 6 of the targets 114 does not improve the uniformity 132 of FIG. 1 any further. Any remaining level of the uniformity 132 is due to radial non-uniformity, which cannot be corrected by adding more of the targets 114 or by rotating the rotating pedestal 110 of FIG. 1.

Figure 17:
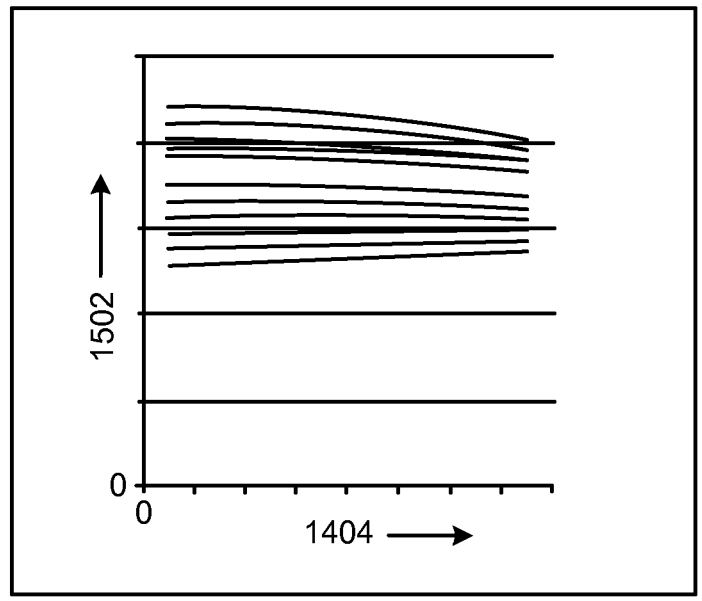
FIG. 17 is a graph illustrating the non-uniformity based on the radius.

Referring now to FIG. 17, therein is shown a graph illustrating the non-uniformity 1502 based on the radius 1404. The non-uniformity 1502 is shown by combining the targets 114 of FIG. 1 of the inner ring 508 of FIG. 5 and the outer ring 510 of FIG. 5 and with the rotating pedestal 110 of FIG. 1.

The non-uniformity 1502 plotted is the standard deviation, expressed as a fraction of an average across the radius 1404 of the carrier 108 of FIG. 1. The plot shows top five curves for the inner ring 508 and bottom six curves for the outer ring 510. The non-uniformity 1502 is improved or achieved when the deposition process includes approximately 30% of the inner ring 508 and 70% of the outer ring 510, as shown by the fourth curve from the bottom of the graph.

Figure 18:
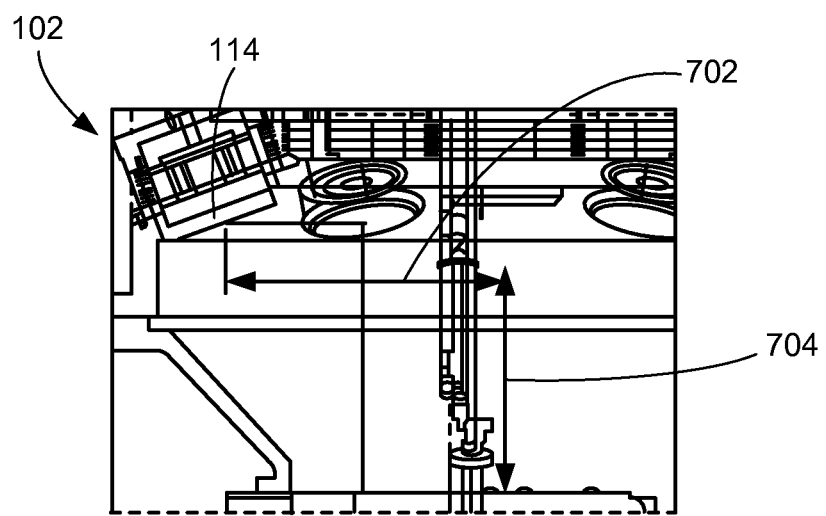
FIG. 18 is a configuration of the horizontal distance and the vertical distance.

Referring now to FIG. 18, therein is shown a configuration of the horizontal distance 702 and the vertical distance 704. FIG. 18 depicts one of the targets 114 at the angle 130 of FIG. 1 with the carrier 108 of FIG. 1. For example, the targets 114 can be on the outer ring 510 of FIG. 5.

The horizontal distance 702 and the vertical distance 704 are shown between one of the targets 114 and the carrier 108. For example, the non-uniformity 1502 of FIG. 15 can be less than 1.0% for the cathodes 102 on the outer ring 510 with the angle 130 of approximately 15 degrees.

Referring now to FIG. 19, therein is shown a cross-sectional view of the shrouds 126 in the deposition system 100. In the multi-cathode PVD chamber, the cross-contamination between sources, such as the cathodes 102, the cross-contamination caused by the materials 103 of FIG. 1 deposited on shields, such as the rotating shield 106 and the conical shield 118, from previous deposition sputtering processes, and contamination on the film can be avoided. The description described herein can relate to SPIN-Transfer-TORQUE Random Access Memory (STT_RAM).

The cross-sectional view depicts a plasma shroud, such as the shrouds 126, in the multi-cathode PVD chamber for reducing or eliminating the cross-contamination. The embodiments of the present invention describe a scheme to contain the deposition process of each of the cathodes 102 and limit the spread of plasma when sputtering one film to areas where other films are deposited and hence limiting the chance of the cross-contamination from occurring.

Each of the cathodes 102 can be dedicated to one of the shrouds 126 that is large in volume compared to a size of one of the cathodes 102. Deposition from one of the cathodes 102 can be mostly contained within one of the shrouds 126.

The shrouds 126 can then be exposed to the carrier 108 one at a time by the rotating shield 106 with the shield holes 104, each of which includes a size equivalent to or approximately the same as a size of an opening of each of the shrouds 126. During the deposition process, each of the shrouds 126 captures most of the deposition and a large portion of the plasma. Thus, any deposit on a common shield or the conical shield 118 and other areas of a process kit can see very little plasma and hence can substantially reduce the cross-contamination.

The spread of the plasma can be limited to one of the shrouds 126. Since there are the shield holes 104 in the rotating shield 106, the plasma can spread around in the multi-cathode chamber 502. By making the shrouds 126 bigger and the rotating shield 106 smaller, the plasma can be kept inside one of the shrouds 126 so minimizing an amount of the plasma that can spread to the rotating shield 106.

Thus, increasing a shroud volume of each of the shrouds 126 and decreasing a shield volume of the rotating shield 106 reduces or eliminates the cross-contamination. If the plasma spreads all over the multi-cathode chamber 502, whatever the plasma remained in the rotating shield 106 can eventually end up on the carrier 108 and so plasma contamination from the cathodes 102 is eliminated by the shrouds 126.

Referring now to FIG. 20, therein is shown a top isometric view of one of the shrouds 126. The top isometric view depicts a 3-dimensional view of one of the shrouds 126.

A geometrical shape of each of the shrouds 126 can be designed such that the shrouds 126 capture most of the materials 103 of FIG. 1 during the deposition process. The shrouds 126 capturing most of the materials 103 results in little or none of the materials 103 remains in the multi-cathode chamber 502 of FIG. 5 and the rotating shield 106 of FIG. 1 therefore eliminating the cross-contamination. Furthermore, the geometrical shape improves the non-uniformity 1502 of FIG. 15 of the carrier 108 of FIG. 1.

The geometrical shape can be designed such that opposite ends, such as a first shroud end 2002 and a second shroud end 2004, have different dimensions. The first shroud end 2002 is narrower than the second shroud end 2004. A first width 2006 of the first shroud end 2002 is less than a second width 2008 of the second shroud end 2004.

Referring now to FIG. 21, therein is shown a cross-sectional view illustrating one of the shrouds 126 and the rotating shield 106. The rotating shield 106 can be very close or adjacent to the cathodes 102. The rotating shield 106 exposes just one of the cathodes 102 at a time. The rotating shield 106 can be above the conical adapter 506.

Referring now to FIG. 22, therein is shown another cross-sectional view illustrating one of the shrouds 126 over the rotating shield 106 for capturing the materials 103 of FIG. 1 from one of the cathodes 102.

Each of the shrouds 126 can include a shroud length 2202 greater than a cathode length 2204 of each of the cathodes 102. As such, each of the shrouds 126 can capture most if not all of one of the materials 103 in one sputtering step so that none of the one of the materials 103 remains before the next sputtering step with another of the materials 103 to eliminate the cross-contamination.

It has been discovered that the shroud length 2202 greater than the cathode length 2204 improves reliability because each of the shrouds 126 has more surface area to capture all of the materials 103 in one sputtering step thereby reducing or eliminating the cross-contamination.

Figures 23, 24:
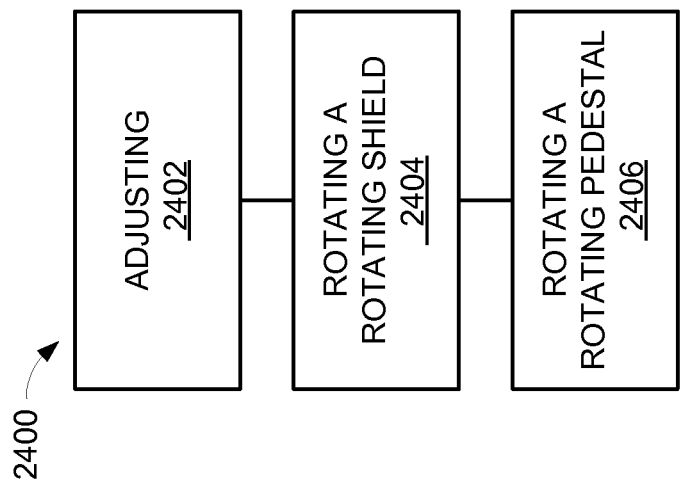
FIG. 23 is a table illustrating results of contamination tests for the multi-cathode chamber of FIG. 5.
FIG. 24 is a flow chart of a method of manufacture of a deposition system in a further embodiment of the present invention.

Referring now to FIG. 23, therein is shown a table illustrating results of contamination tests for the multi-cathode chamber 502 of FIG. 5. The results show that in conclusion, there is a need for the rotating shield 106 of FIG. 1 and individual shrouds 126 of FIG. 1 with the shroud length 2202 of FIG. 22 as previously described to minimize cross-target contamination or the cross-contamination.

The cross-contamination is compared between a baseline without the embodiments of the present invention and a design with the rotating shield 106 and a long shroud, such as each of the shrouds 126 having the shroud length 2202 greater than the cathode length 2204 of FIG. 22. The results show that counts due to the cross-contamination significantly reduce. The counts are defined as numbers of $10^{10}$ atoms per centimeters square (atoms/cm$^2$). The counts refer to numbers of atoms of material A on the carrier 108 of FIG. 1 that has been sputtered with material A and then material B.

Referring now to FIG. 24, therein is shown a flow chart of a method 2400 of operation of a deposition system in a further embodiment of the present invention. The method 2400 includes: adjusting a cathode in a block 2402; rotating a rotating shield below the cathode for exposing the cathode through a shroud below the cathode and through a shield hole of the rotating shield in a block 2404; and rotating a rotating pedestal for producing a material to form a carrier over the rotating pedestal, wherein the material having a non-uniformity constraint of less than 1% of a thickness of the material and the cathode having an angle between the cathode and the carrier in a block 2406.

Accordingly, it has been discovered that the values of the embodiments described above provide the advantages that improve overall capabilities of a product line and reduce the cost of the product line in general. The overall capabilities are improved by the deposition system 100 of FIG. 1 capable of depositing different materials in a single chamber. The cost of the product line is reduced due to minimum hardware changes.

These advantages are provided due to abilities to apply RF or DC supply on the same cathode, apply different materials to the same cathode, and perform a sputtering process without the cross-contamination. These advantages are provided also due to achieving a very high level of the uniformity 132 of FIG. 1 based on the non-uniformity (NU) constraint with the rotating pedestal 110 of FIG. 1 and implementing a single bit rotating shield or the rotating shield 106 of FIG. 1 to achieve improved particle performance.

Thus, it has been discovered that the deposition system 100 of the embodiments of the present invention furnishes important and heretofore unknown and unavailable solutions, capabilities, and functional aspects for the deposition system 100 with multiple of the cathodes 102 of FIG. 1. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing deposition systems fully compatible with conventional manufacturing methods or processes and technologies.

Another important aspect of the embodiments of the present invention is that it valuably supports and services the historical trend of reducing costs, simplifying systems, and increasing performance.

These and other valuable aspects of the embodiments of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of operation of a multi-cathode chamber comprising:
   adjusting one of a plurality of cathodes, each of the plurality of cathodes having a length and a volume;
   rotating a rotating shield below the plurality of the cathodes to expose one of the plurality of the cathodes through a shroud below the one of the plurality of the plurality of the cathodes and through a shield hole of the rotating shield, the shield hole below the shroud; and
   rotating a rotating pedestal to deposit a material on a carrier on the rotating pedestal, the material having a non-uniformity constraint of less than 1% of a thickness of the material and the one of the plurality of the cathodes having an angle between a plane of the one of the plurality of the cathodes and a plane of the carrier, the angle in a range of 30 degrees to 50 degrees, wherein the shroud has a length that is greater than the length of the one of the plurality of the cathodes and the shroud has a volume that is greater than the volume of the one of the plurality of cathodes and the shroud is configured to contain a majority of the material from a target that does not deposit on the carrier and to prevent cross-contamination between the plurality of the cathodes.

2. The method as claimed in claim 1 further comprising adjusting a magnet-to-target spacing between a magnet of the one of the plurality of the cathodes and a target below the one of the plurality of the cathodes for improving uniformity of the material.

3. The method as claimed in claim 1 wherein adjusting the one of the plurality of the cathodes includes adjusting the one of the plurality of the cathodes by rotating a swing arm of the one of the plurality of the cathodes for forming the angle.

4. The method as claimed in claim 1 wherein rotating the rotating shield includes rotating the rotating shield to expose the one of the plurality of the cathodes through the shroud.

5. The method as claimed in claim 1 wherein at least 80% of the material from a target not deposited on the carrier is contained in the shroud.

6. A method of forming a layer on a carrier comprising:
depositing the layer comprising a material from one of a plurality of cathodes of a multi-cathode physical deposition chamber on the carrier having a plane, each of the one of the plurality of cathodes having a length and a volume through a shroud below the cathode and through a shield hole of a rotating shield, the shield hole below the shroud and the one of the plurality of the cathodes having a plane, the one of the plurality of the cathodes having an angle between the plane of the one of the plurality of the cathodes and the plane of the carrier, the angle in a range of 30 degrees to 50 degrees such that the material has a non-uniformity constraint of less than 1% of a thickness of the material, wherein the shroud has a length that is greater than the length of the one of the plurality of the cathodes and the shroud has a volume that is greater than the volume of the one of the plurality of cathodes and the shroud is configured to contain a majority of the material from a target that does not deposit on the carrier and to prevent cross-contamination between the plurality of the cathodes.

7. The method as claimed in claim 6 wherein forming the layer further includes forming a stack of layers with materials, each of the materials having the non-uniformity constraint.

8. The method as claimed in claim 6 wherein forming the layer further includes forming a Magnetic Random Access Memory device.

9. The method as claimed in claim 6 wherein forming the layer further includes forming a stack of layers having a thickness from 7 to 150 Angstroms.

10. The method as claimed in claim 6 wherein forming the layer further includes forming a stack of layers with materials selected from the group consisting of Tantalum Nitride, Titanium Nitride, Ruthenium, Tantalum, Cobalt Iron Boron, Magnesium Oxide, Cobalt Iron, Iridium Manganese metal, Platinum Manganese, and a combination thereof.

\* \* \* \* \*